(12) United States Patent  (10) Patent No.: US 7,687,207 B2
Graur et al.  (45) Date of Patent: Mar. 30, 2010

(54) SYSTEM FOR COLORING A PARTIALLY COLORED DESIGN IN AN ALTERNATING PHASE SHIFT MASK

(75) Inventors: Ioana Graur, Poughkeepsie, NY (US); Young O. Kim, San Jose, CA (US); Mark A. Lavin, Katonah, NY (US); Lars W. Liebmann, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 112 days.

(21) Appl. No.: 12/121,371

(22) Filed: May 15, 2008

(65) Prior Publication Data

US 2008/0244503 A1 Oct. 2, 2008

Related U.S. Application Data

(63) Continuation of application No. 10/710,224, filed on Jun. 28, 2004, now Pat. No. 7,378,195.

(51) Int. Cl.
*G03F 1/00* (2006.01)
(52) U.S. Cl. ....................................................... 430/5
(58) Field of Classification Search .................... 430/5, 430/394; 716/19, 20, 21
See application file for complete search history.

(56) References Cited

U.S. PATENT DOCUMENTS

| 5,883,813 A | 3/1999 | Kim et al. |
| 6,066,180 A | 5/2000 | Kim et al. |
| 6,609,245 B2 | 8/2003 | Liebmann et al. |
| 6,753,115 B2 | 6/2004 | Zhang et al. |
| 6,901,576 B2 | 5/2005 | Liebmann et al. |

OTHER PUBLICATIONS

Lars Liebmann, Ioana Graur, William Leipold, James Oberschmidt, David O'Grady, Denis Regaill: "Alternating Phase Shifted Mask for Logic Gate Levels, Design and Mask Manufacturing"; IBM Microelectronics, East Fishkill, NY; 12 pages.

*Primary Examiner*—Stephen Rosasco
(74) *Attorney, Agent, or Firm*—DeLio & Peterson, LLC; Peter W. Peterson

(57) ABSTRACT

A method of designing an alternating phase shifting mask for projecting an image of an integrated circuit design. Phase units are binary colorable within each unit of the hierarchical circuit design, e.g., cell, an array, a net, or array of nets and/or cells, the phase shapes. The assignment of phases or colors within a hierarchical unit will be correctly binary colored to satisfy the lithographic, manufacturability and other design rules, referred to collectively as coloring rules. During assembly with other units, the coloring of phases in a hierarchical unit may change (e.g., be reversed or flipped), but the correct binary colorability of a hierarchical unit is preserved, which simplifies assembly of the integrated circuit layout.

13 Claims, 13 Drawing Sheets

SYSTEM FOR COLORING A PARTIALLY COLORED DESIGN IN AN ALTERNATING PHASE SHIFT MASK

This is a Continuation of application Ser. No. 10/710,224, filed Jun. 28, 2004, now U.S. Pat. No. 7,378,195.

BACKGROUND OF THE INVENTION

1. Field of the Invention

The present invention is directed to the manufacture of masks used in the lithographic production of integrated circuits and, in particular, to the manufacture of alternating phase shifting masks (altPSMs).

2. Description of Related Art

As an alternative to chrome on glass (COG) masks used in the lithographic production of integrated circuits and other components, alternating phase shifting masks (altPSMs) have been employed in order to increase the resolution of the critical (active area) patterns projected. Such increased resolution enables smaller line widths to be exposed on the resist and consequently etched into or deposited on the wafer substrate. This is done by manipulating the electric field vector or phase of the energy beam, e.g., visible or ultraviolet light, used in the lithographic process. This phase variation is achieved in PSMs by modifying the length that a light beam travels through the mask material. By recessing the mask to an appropriate depth, light traversing the thinner portion of the mask and light traversing the thicker portion of the masks will be 180° out of phase, that is, their electric The process of defining portions of the mask as 0° phase regions and other portions as 180° phase regions is generally referred to as phase coloring. Any other pairs of phase regions of shapes may be used in phase coloring, provided that they are opposite phases, i.e., they are 180° out of phase. Assigning a color is therefore analogous to determining any binary quality, and two opposite phases or colors may also be referred to as one (1) or zero (0), or positive (+) or negative (−). Techniques for automatic phase coloring are described in Kim et al. U.S. Pat. No. 5,883,813 and Liebmann et al. U.S. Pat. No. 6,609,245, the disclosures of which are hereby incorporated by reference.

AltPSM shapes are widely used in masks for logic circuit designs. Currently, most logic designs consist of a large fraction of synthesized functional blocks known as random logic macros (RLMs). Some chips, such as ASICs, may be entirely synthesized from a standard cell library of circuit designs. The designs or books in a standard cell library may be used hundreds or thousands of times each in a chip design. In each placement, the individual cell, or book, is likely to have different neighbors to the left, right, above and below. Some design methodologies also allow books to be flipped or mirrored when placed, so that opposite phase shapes are reversed. The combinations of such books are virtually limitless.

Because of potential for design rule violations when placing books next to each other, most standard cell libraries have fairly conservative rules about the positioning of phase shapes inside cell boundaries and sharing of phase shapes between adjacent cells. Interaction of phase shapes between neighboring cells may cause phase coloring conflicts. Additionally, when there are phase shape interactions between cells in an RLM, there are concerns about data volume and run time for altPSM generation in a mask design due to unrolling of phase shapes, resulting in the flattening of the hierarchy of the arrays built up from individual cells. In practice, in virtually all cases the assignment of phase shapes end up at the top level of the hierarchy.

One solution to this problem is to prohibit interaction between phase shapes in neighboring cells by enforcing a design rule that ensures that all phase shapes are placed inside cell boundaries by a distance of at least one-half the minimum phase-to-phase spacing rule of the system, i.e., the distance between opposite phase shapes at which no deleterious interaction of opposite phase light occurs in the lithographic process being used. While this approach may work for some standard cell libraries, for others some interaction between phase shapes may be inevitable.

Further complications for altPSM mask design arise in the hierarchical construction of a full chip. Static random access memory (SRAM) circuit portions are often optimized by hand, including the insertions or alteration of phase shapes. There is no current method to handle the phase coloring at the boundaries of such components automatically.

There is a great need in this art for a method of automatically assigning and changing, if necessary, phase colors as chip circuit designs are being assembled to make the altPSM mask.

SUMMARY OF THE INVENTION

Bearing in mind the problems and deficiencies of the prior art, it is therefore an object of the present invention to provide an improved method of designing alternating phase shifting masks in which the phase shape conflicts within the design layout may be resolved.

It is another object of the present invention to provide a method for assembling cells for altPSM masks to insure that the cell design is phase compliant.

A further object of the invention is to provide a method of using pre-phase colored elements for use in designing altPSM layouts for chip assembly, and automatically correcting any conflicts between the pre-colored cells.

It is yet another object of the present invention to provide a method for automatically assigning and changing, if necessary, phase colors as chip circuit designs are being assembled to make the altPSM mask.

It is a further object of the present invention to provide a method for automatically assigning phase colors, as described above, without introducing phase conflict in previously colored portions of an altPSM design layout.

Still other objects and advantages of the invention will in part be obvious and will in part be apparent from the specification.

The above and other objects, which will be apparent to those skilled in the art, are achieved in the present invention which is directed to a method of designing an alternating phase shifting mask for projecting an image of an integrated circuit design. Coloring rules are provided for assigning phases to phase shifting shapes of an alternating phase shifting mask. There is also provided a first cell comprising at least one phase shifting shape assignable to a first phase and at least one phase shifting shape assignable to a second phase opposite to the first phase, at least one of the phase shifting shapes being adjacent to an edge of the first cell. There is further provided a second cell comprising at least one phase shifting shape assignable to a first phase and at least one phase shifting shape assignable to a second phase opposite to the first phase, at least one of the phase shifting shapes being adjacent to an edge of the second cell. All phase shifting shapes within the first and second cells are binary colorable according to the coloring rules. The method then includes juxtaposing an edge of the first cell along an edge of the second cell such that the phase shifting shapes adjacent the respective first and second cell edges are adjacent each other, and creating a cell array comprising the first and second cells arranged so that the array is colorable in accordance with the coloring rules while preserving the binary colorability of the first and second cells. Phases are preferably assigned to the phase sifting shapes after juxtaposing the edges of the first and second cells.

The method may further include assigning phases to the phase shifting shapes of the first and second cells and, after juxtaposing the edge of the first cells along the edge of the second cell, determining any spacing between the adjacent phase shifting shapes in the first and second cells, and determining any difference in phase between the adjacent phase shifting shapes in the first and second cells. If the adjacent phase shifting shapes in the first and second cells lie less than a predetermined minimum spacing required for system resolution, and if such adjacent phase shifting shapes are of opposite phase, the method then reverses the phase of the phase shifting shapes in one of the first and second cells such that the adjacent phase shifting shapes are of the same phase. If the adjacent phase shifting shapes in the first and second cells are greater than the predetermined minimum spacing but less than a spacing whereby there is no interaction of transmitted light between phase shapes, a dummy space is inserted between the phase shifting shapes. The method then includes creating the cell array of the first and second cells.

If the adjacent phase shifting shapes in the first and second cells contact each other, and if such adjacent phase shifting shapes are of opposite phase, the method then includes reversing the phase of the phase shifting shapes in one of the first and second cells such that the adjacent phase shifting shapes are of the same phase; or, if the adjacent phase shifting shapes in the first and second cells do not contact each other but are less than a predetermined minimum spacing, and if such adjacent phase shifting shapes are of opposite phase, the method then includes reversing the phase of the phase shifting shapes in one of the first and second cells such that the adjacent phase shifting shapes are of the same phase.

The first cell may comprise an end cell of a first array of cells having a plurality of phase shifting shapes of first and second phases and, if the adjacent phase shifting shapes in the first and second cells are determined to be spaced less than the predetermined minimum spacing and of opposite phase, all of the phase shifting shapes in the first array of cells are reversed prior to creating the cell array of the first and second cells.

The cells may comprises phase shifting shapes to project an image of an SRAM array or of a logic array, and the cells may form a linear or a non-linear array.

The first cell may comprise a phase shifting shape of the first phase adjacent one edge and a phase shifting shape of the second phase adjacent an opposite edge of the cell.

The method may further include providing a third cell comprising at least one phase shifting shape of a first phase and at least one phase shifting shape of a second phase opposite to the first phase, at least one of the phase shifting shapes being adjacent to an edge of the first cell. In such case, the method then includes juxtaposing an edge of the first cell along an edge of the first or second cell such that at the phase shifting shapes adjacent the respective third cell and first or second cell edges are adjacent each other, and reversing the phase of the phase shifting shapes in one of the third cell and first or second cells such that the adjacent phase shifting shapes are of the same phase if the adjacent phase shifting shapes in the third cell and first or second cells are determined to be spaced less than the predetermined minimum spacing and of opposite phase. The method then creates a cell array of the first, second and third cells.

The phase shifting shapes in the first cell may be prevented from being reversed, such that the phase shifting shapes in the second cell are reversed if the adjacent phase shifting shapes in the first and second cells are determined to be spaced less than the predetermined minimum spacing and of opposite phase.

The method may further include merging the adjacent phase shifting shapes in the first and second cells.

The method may also include determining which of the first and second cells has more phase shifting shapes, and reversing the phase of the phase shifting shapes in the one of the first and second cells that has more of the phase shifting shapes.

In another aspect, the present invention provides a program storage device readable by a machine, tangibly embodying a program of instructions executable by the machine to perform the aforementioned method steps for designing a layout of an alternating phase shifting mask, wherein the alternating phase shifting mask to be used to project an image of an integrated circuit design.

In a further aspect, the present invention provides an article of manufacture comprising a computer-usable medium having computer readable program code means for practicing the aforementioned method steps.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1-17 of the drawings in which like numerals refer to like features of the invention.

The present invention permits phase design and phase transmission assignments to be optionally made (i.e., pre-colored) within correctly colorable units of a hierarchical design, for example, at the book or small macro level (referred to as a cell), then in arrays of individual cells, which are assembled into nets, and the nets are further combined into arrays of nets and cells. Within each unit of the hierarchical design, e.g., cell, an array, a net, or array of nets and/or cells, the phase shapes are binary colorable. Stated another way, the assignment of phases or colors, when made within a hierarchical unit, will be correctly binary colored to satisfy the lithographic, manufacturability and other design rules, referred to collectively as coloring rules. The method of the present invention performs cell-based or hierarchical unit-based coloring and fits the cell or other hierarchical units together within the entire hierarchical design, using standard wiring and placement tools. The invention uses phase compliant design at the cell or unit level, with the ability to define boundary conditions between adjacent units for hierarchical colorability. In accordance with the present invention, during assembly with other units, the coloring of phases in a hierarchical unit may change (e.g., be reversed or flipped), but the correct binary colorability of a hierarchical unit is preserved, which simplifies assembly of the integrated circuit layout.

One preferred embodiment implements the identical color scheme for the SRAM cell within a standard post tapeout optimization tool by merging connecting phase shapes in the space formed by a so-called "dummy" space formed between cells (explained further below). If the dummy space, after assembly, belongs to two different nets ending in the same color, e.g., a 0° phase shape, a phase transition across the dummy space will be ensured by reversing the phase or color of all the phase shapes in one of the nets.

Figure 1:
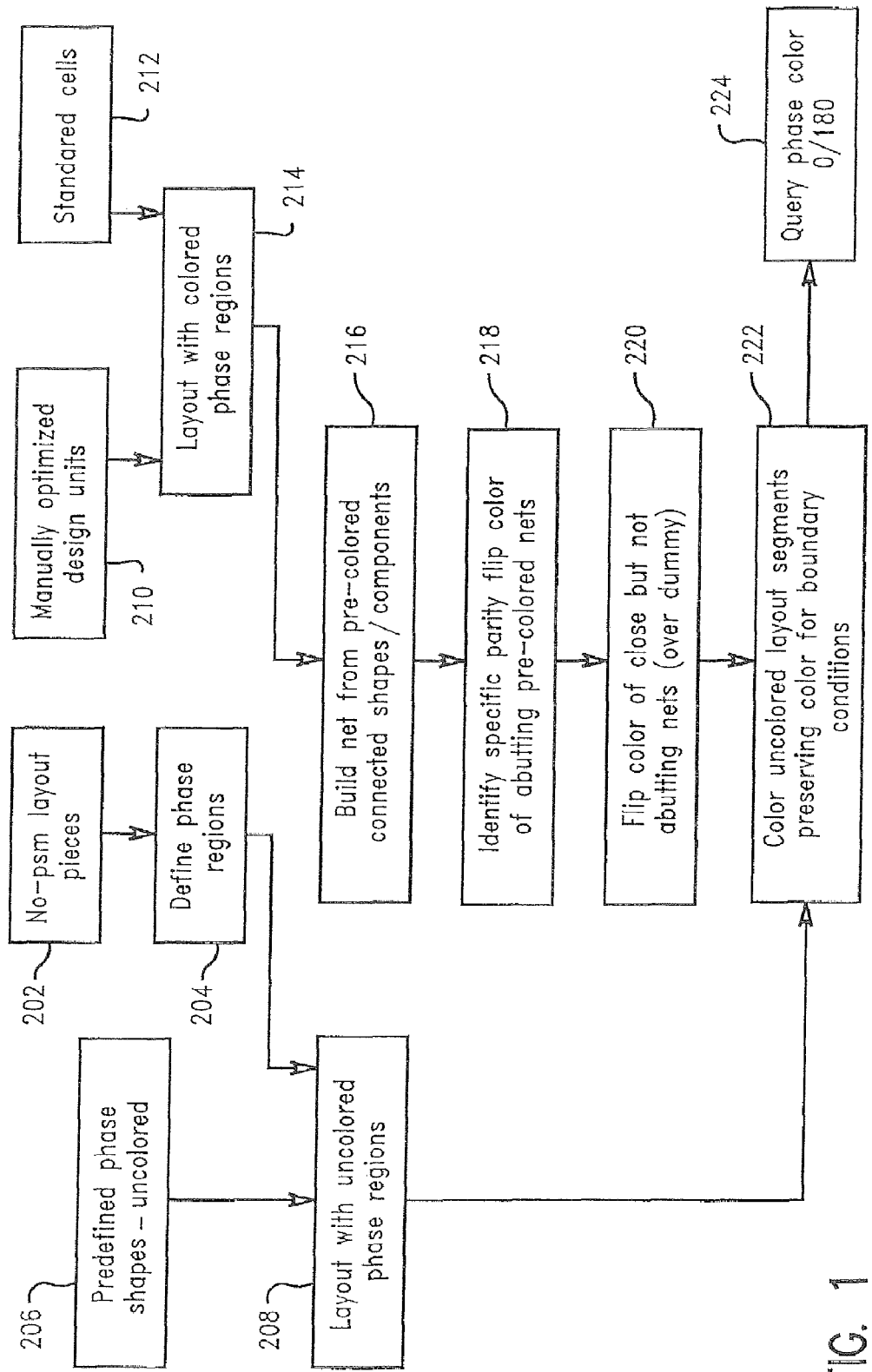
FIG. 1 is a flow chart illustrating the preferred method of coloring a partially colored design in an alternating phase shift mask.

The steps for practicing the preferred method of coloring a partially colored design in an alternating phase shift mask are illustrated in the flow chart depicted in FIG. 1. The present invention may be utilized to altPSM color phase shapes that are initially uncolored, or to correct or confirm the cell colors of pre-colored altPSM mask layouts. When starting with manually optimized design units 210 or standard cells 212, both are initially laid out 214 with colored phase regions designating 0° and 180° phase shifting regions. The pre-colored unit cells are subsequently juxtaposed and connected to form nets of the cells 216, and any phase color conflicts in adjacent cells are corrected by flipping, i.e., reversing, the color of one or the other of the cells. After phase coloring is correct, the net of cells is juxtaposed in contact with another net of phase-colored cells 218; if there is any coloring conflict between contacting cells of the nets, the phase colors of one of the nets is completely reversed. If the net of cells is close to, but not in contact with another net, 220, but the spacing is greater than a predetermined minimum $d_1$ needed for resolution in the lithographic and manufacturing system and less than a spacing at which there is no interaction of transmitted light between the phase shapes $d_2$, a "dummy" shape is inserted, and any conflict is solved by completely reversing the phases of one of the nets adjacent the dummy shape. Any uncolored segments in the nets or in adjacent cells are then colored to preserve color boundary conditions 222 by querying the phase color for either 0° and 180° phase shifting regions 224.

If starting with no phase shifting layout pieces 202, phase regions are defined 204. One may also start with predefined, but uncolored, phase shapes for the altPSM. In either case, cell or net layouts are created with uncolored phase regions 208. These uncolored layouts are then colored to preserve boundary color conditions 22, as before. The method steps of FIG. 1 are described further below in connection with an example assembly of an altPSM layout for a chip circuit design from individual cells used in circuit design.

Figure 2:
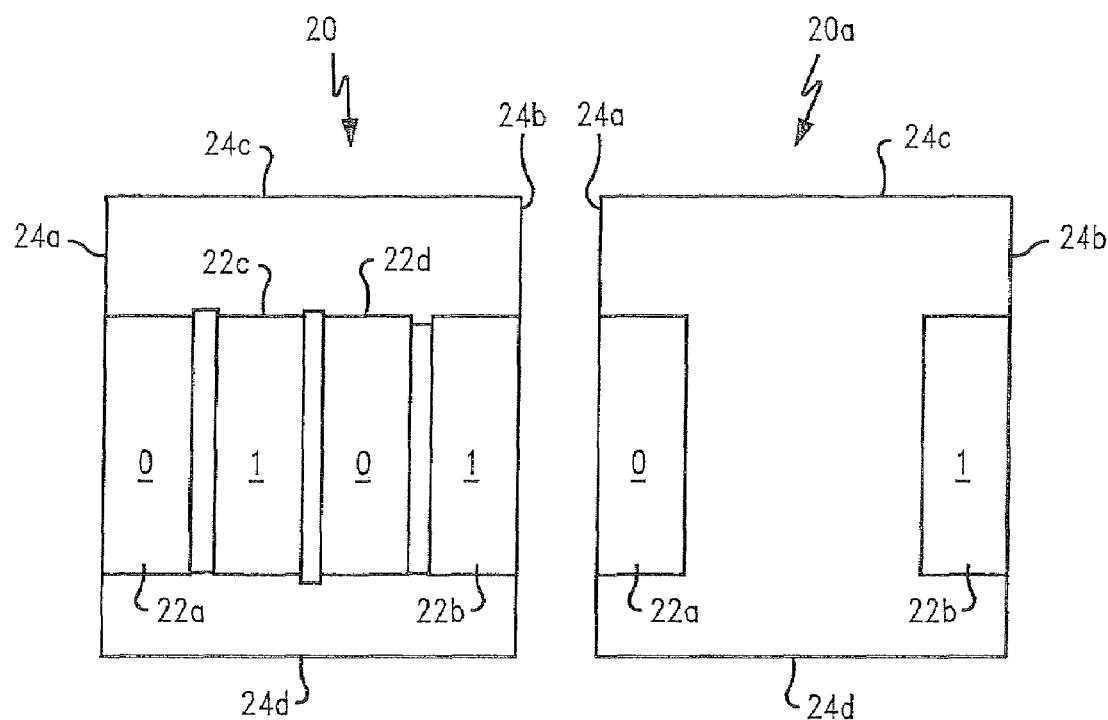
FIG. 2 is a plan view of a pair of individual cells from a standard cell library of circuit designs showing phase shifting shapes to be used in an altPSM mask.

FIG. 2 shows a pair of individual cells having phase shifting shapes to be used in the altPSM mask to be fabricated. The individual cells 20, 20a are typically from a standard cell library of circuit designs. Each cell has opposed right and left side edges 24a, 24b and opposed top and bottom edges 24c, 24d. Cell 20 contains phase shifting shapes 22a, 22b, 22c, 22d, of which 22a and 22d are 0° phase regions, which impart no phase shift to light transmitted therethrough, and 22b and 22c are 180° phase regions, which impart a 180° phase shift to the light. For simplicity of illustration, the 0° phase regions are designated by a "0" and the 180°phase regions are designated by a "1." Any other combination of degree of phase shifting may be used, provided that the difference between the two phases is 180°. Such phases shifting regions may be created in the actual mask by any means known in the art, such as by varying the thickness of, for example, a quartz mask to different levels at the different phase shifting regions. The layout of these shapes on an altPSM mask determines the circuit lines and other components projected. When light is transmitted through the phase shifting shapes of cell 20, lines are created between the opposite phase shifting shapes 0 and 1 as a result of the interaction and cancellation between the light beams.

In both cells 20 and 20a, phase shifting regions 22a and 22b lie adjacent and along the cell boundaries. The individual cells described herein will typically have a plurality of phase shifting regions of opposing phase internal to the cell, such as 22c, 22d in cell 20, but for simplicity of illustration, the internal portions will be omitted and the cells will be shown with just the boundary phase shifting regions, as with cell 20a. Conventional COG segments may also be used in the interior portions of the altPSM mask designs.

Figure 3:
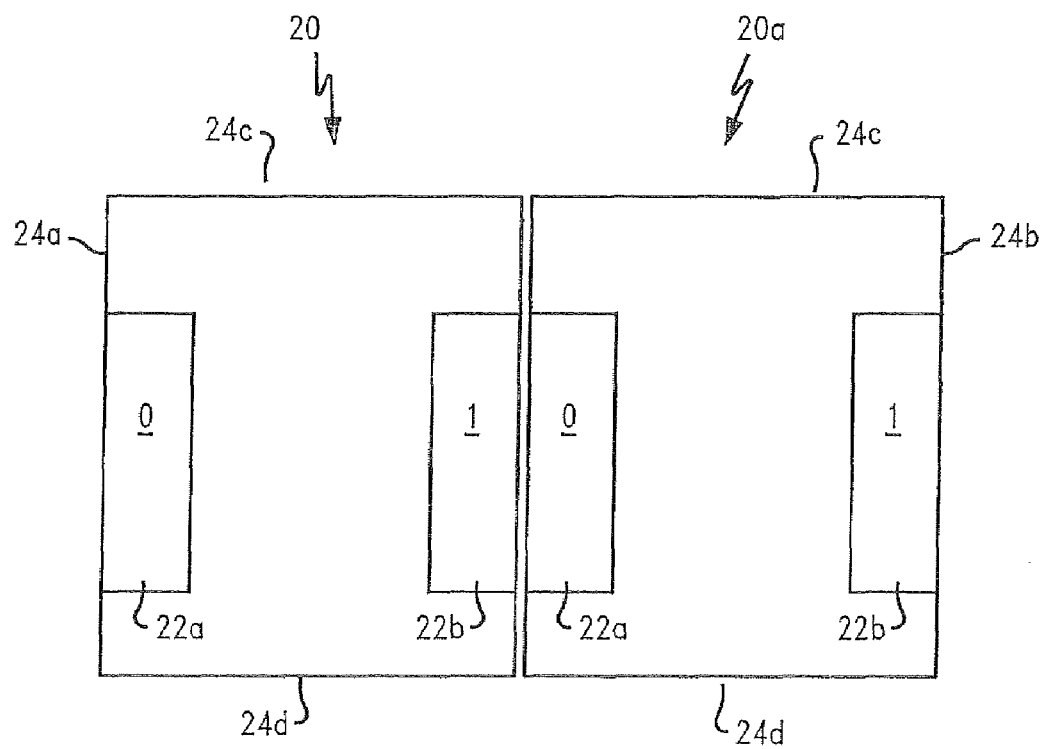
FIG. 3 is a plan view of the combination of the cells of FIG. 2 to form a first net, which shows phase conflicts at the adjacent boundaries.

If cells 20 and 20a from the same library book are juxtaposed alongside each other to form a first net, as in FIG. 3, a conflict is created by the contact between phase I of cell 20 and phase 0 of cell 20a (where the spacing between adjacent edges is less than $d_1$). Unless remedied, this contact of different phases will produce a line between the two phase shifting shapes 22b of cell 20 and 22a of cell 20a, where no line is desired. To correct this conflict between the two units at the boundary, the colored shapes or phases in one of the units (cell 20a) are reversed, or flipped, according to boundary conditions in their environment.

To enable this coloring rule or function to be effected, the cells may be identified with one argument or designation that indicates that the phases or colors may be reversed in the cell without affecting the circuit portions to be created by the mask, i.e., that the cell is flippable, or with another argument or designation that indicates that there is some constraint in the cell or net that prevents the phases or colors from being reversed, i.e., that the cell is not flippable. This flippable/not flippable argument provides one of the coloring rules in accordance with the present invention.

Figure 4:
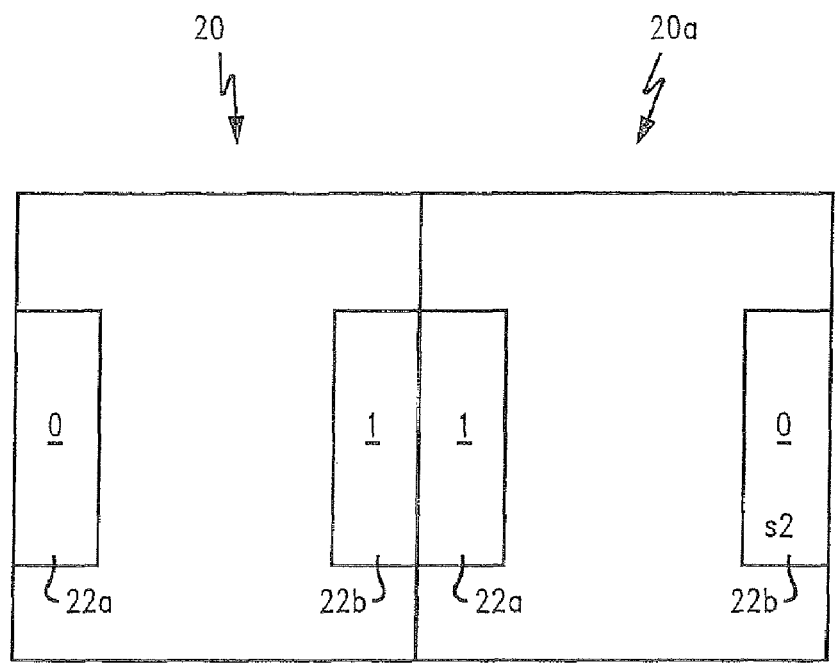
FIG. 4 is a plan view of the resolution of the conflict of FIG. 3, by flipping the phases of one of the cells.

The result of the reversal or flipping of the phase shapes of FIG. 3 is shown in FIG. 4, wherein only the phase shapes of cell 20a are reversed in phase or color. The contacting phase shapes 22b of cell 20 and 22a of cell 20a are now identically phased or colored. If the argument of cell 20a were set to, indicate that the cell was not flippable, the colors of cell 20a would not have changed, and instead the phases or colors of cell 20 would have reversed (assuming that its argument was set to indicate that it was flippable). If the argument for both were set to indicate that they were not flippable, then neither cell could be reversed in phase, and some other solution would have to be found.

Figure 5:
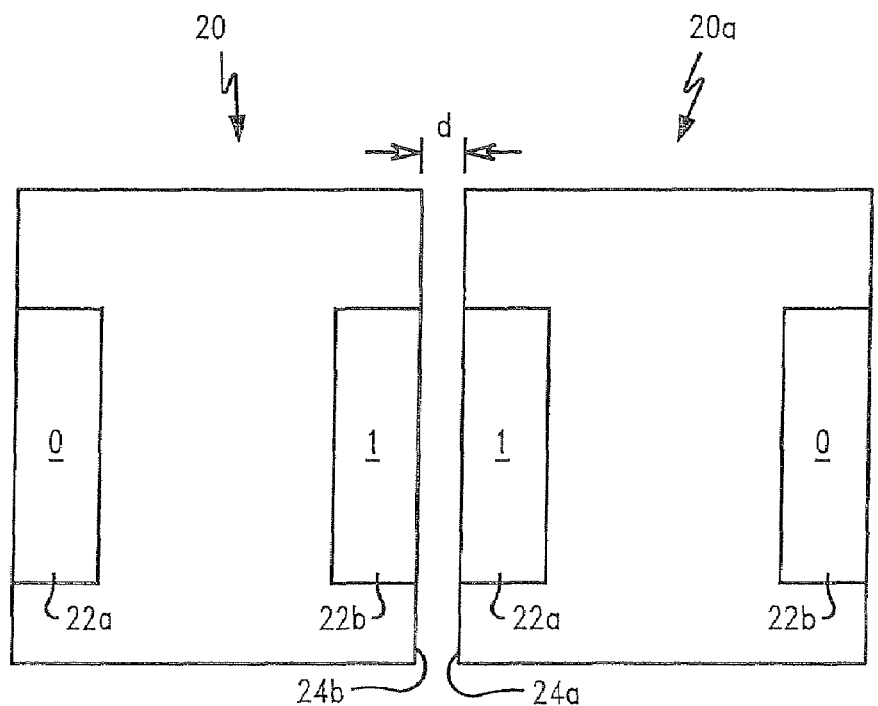
FIG. 5 is a plan view of the combination of the cells of FIG. 2 to form a first net, with spacing between the cell boundaries.

Likewise, if the assembled boundary phase shapes 22b of cell 20 and 22a of cell 20a did not contact each other, but were spaced apart a distance less than a predetermined minimum spacing $d_1$, then one or the other would also be flipped to achieve the same color. This is shown in FIG. 5, where space d separates phase shapes 22a and 22b, and $d<d_1$. The predetermined minimum spacing $d_1$ is that space that is not resolvable, and is dependent on the lithographic system, mask manufacturability, and design rules governing the size and spacings of phase shapes. Optionally, the phase shapes 22b of cell 20 and 22a of cell 20a may be merged together.

The flippable/not flippable coloring rule or function permits a hierarchical coloring methodology in which lower level design elements, for example, standard library cells, may be colored once, and then stored with their colors in a library for later incorporation (with or without flipping) into a larger design unit.

Figure 6:
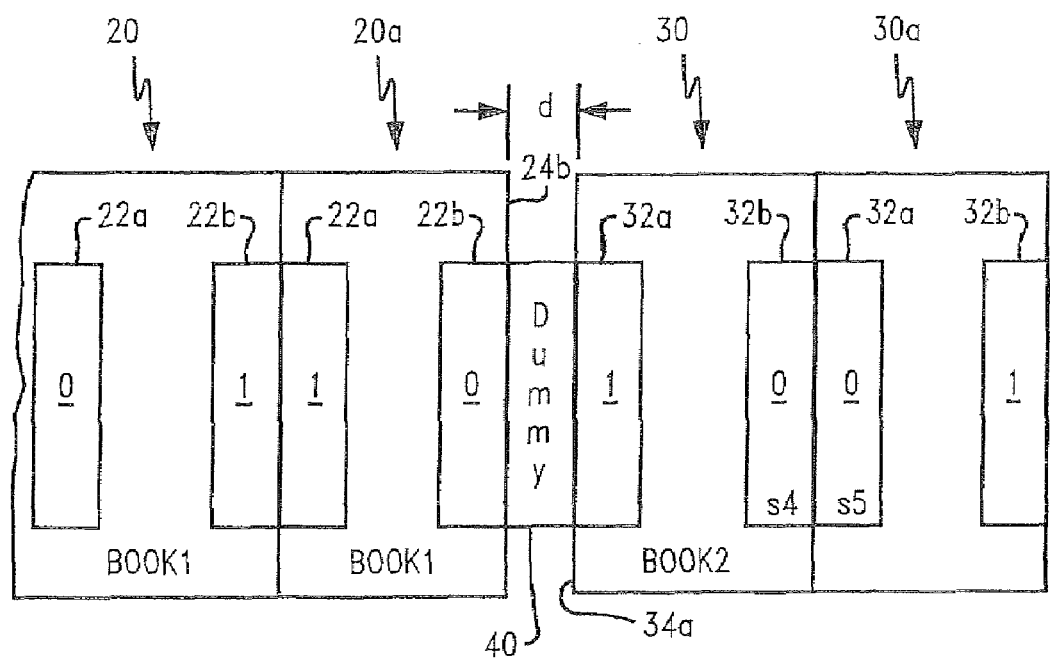
FIG. 6 is a plan view of the cell net of FIG. 4, to which is added another net, and the "dummy" line to be created between the two nets.

The addition of another cell to the net formed by assembly of cells 20 and 20a is shown in FIG. 6. Cell 30 from another book, Book 2, from a standard cell library is added to the right of cell 20a. Since the spacing d between the adjacent boundaries 24b and 34a of cells 20a and 30, respectively, is greater than the minimum resolvable spacing $d_1$ and less than the minimum no interaction spacing $d_2$, a "dummy" shape or line 40 is inserted to enforce a phase transition between boundary phase shape 22b of cell 20a and boundary phase shape 32a of cell 30a, so that they are of opposite phases, as shown in FIG. 6.

If boundary phase shape 32a of cell 30 were pre-colored to phase 0, a color-reversing rule or function would be applied to reverse the colors in the Book 2 cell 30, as well as any other Book 2 cells connected thereto in a net. In this manner phase shape 32a would then have the phase or color 1, opposite to the color 0 of phase shape 22b of cell 20a.

To assign the other phase shape colors consistently in any cells directly connected in a net to cell 30, a color connecting rule or function would assign the color 0 to boundary phase shape 32a of adjacent cell 30a, since phase shapes 32b and 32a of cells 30 and 30a, respectively, contact each other, as shown in FIG. 6. This would also occur if adjacent cell 30a were spaced from cell 30 a distance less than the predetermined minimum resolvable spacing, $d_1$.

To assign the other phase shape colors consistently in any cells directly connected in a net to cell 30, a color connecting rule or function would assign the color 0 to boundary phase shape 32a of adjacent cell 30a, since phase shapes 32b and 32a of cells 30 and 30a, respectively, contact each other, as shown in FIG. 6. This would also occur if adjacent cell 30a were spaced from cell 30 a distance less than the predetermined minimum resolvable spacing, $d_1$.

Figure 7:
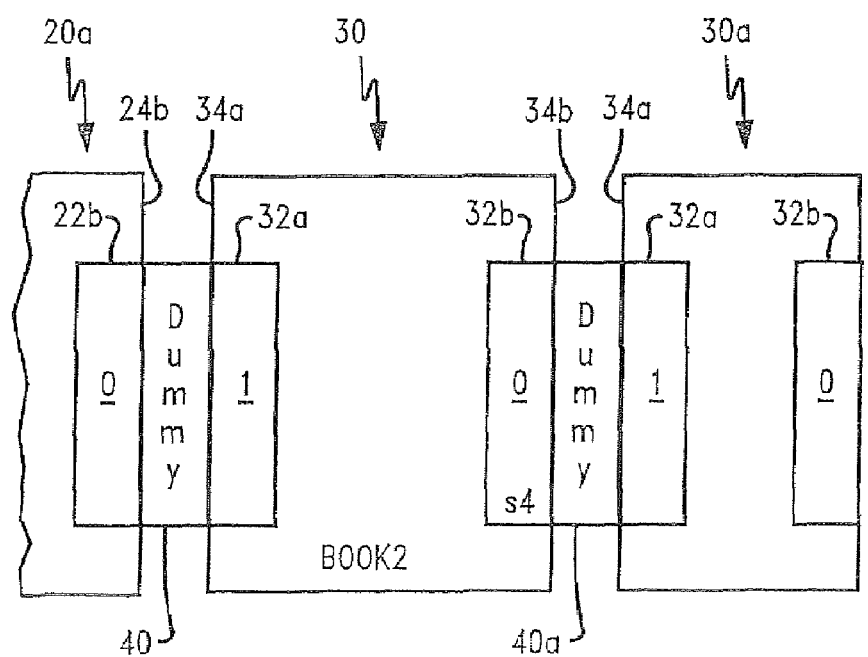
FIG. 7 is a plan view of another net added to the cell net of FIG. 4, with "dummy" lines to be created between the first and second net, and in the second net.

If the next cell adjacent to cell 30 were to be spaced at a distance $d_1<d<d_2$, to also create a dummy line, a further coloring rule or function will assign the adjacent phase shape in the next cell the color opposite to the adjacent phase shape of cell 30. This is shown in FIG. 7, where dummy shape 40a is inserted between phase shape 32b of cell 30 (color 0) and phase shape 32a of cell 30a (color 1).

Because boundary phase shape 22b of cell 20a and boundary phase shape 32a of cell 30, and boundary phase shape 32b of cell 30 and boundary phase shape 32a of cell 30a are within the distance $d_2$ of interaction and are resolved (i.e., are greater than spacing $d_1$), a non-functional or dummy line would be formed on the resist by the interaction and cancellation of the light passing through adjacent, opposite phase shapes formed on a finished mask.

Figure 8:
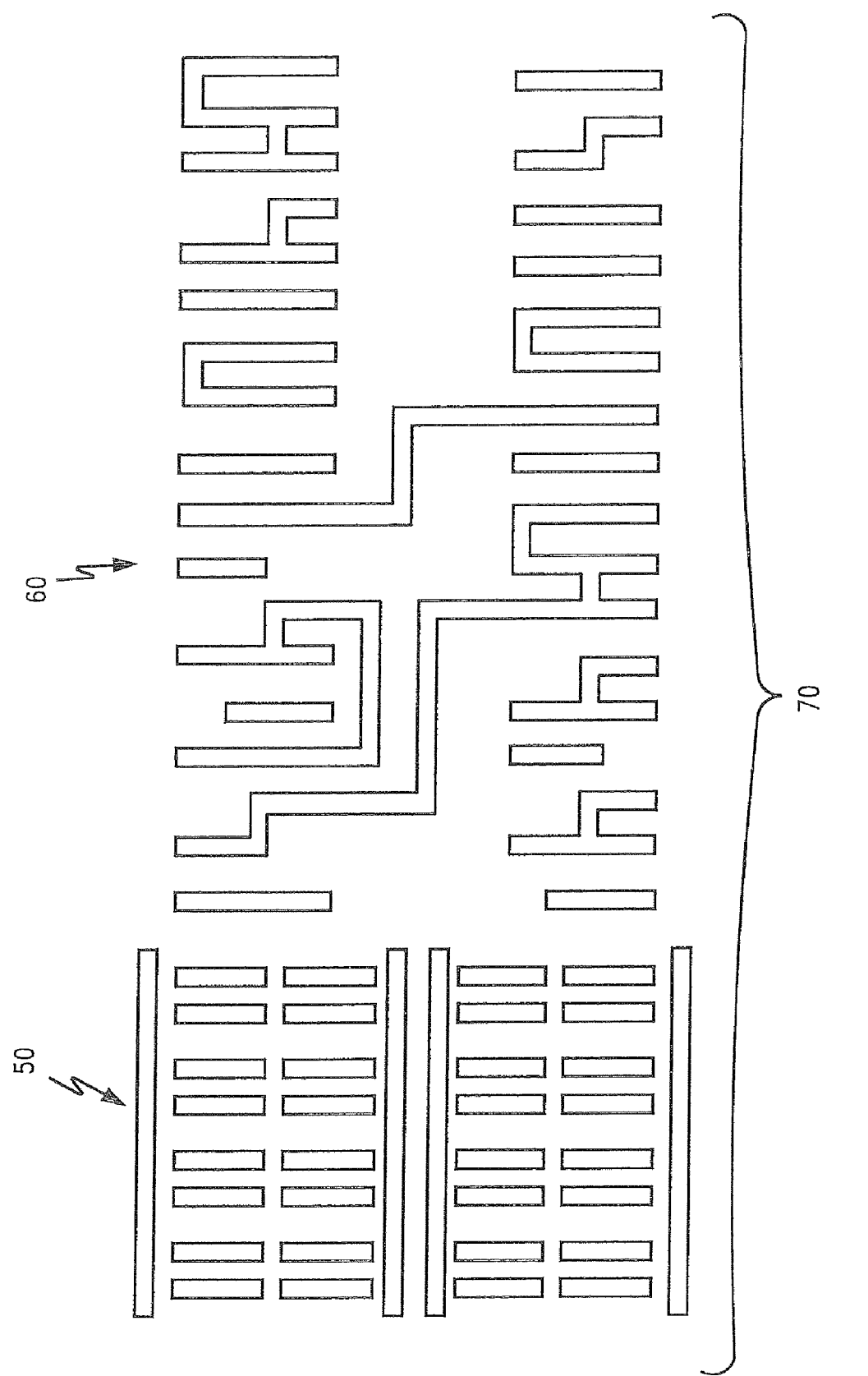
FIG. 8 is a plan view of a chip circuit design used to illustrate the design of the altPSM in accordance with the present invention.
Figure 9:
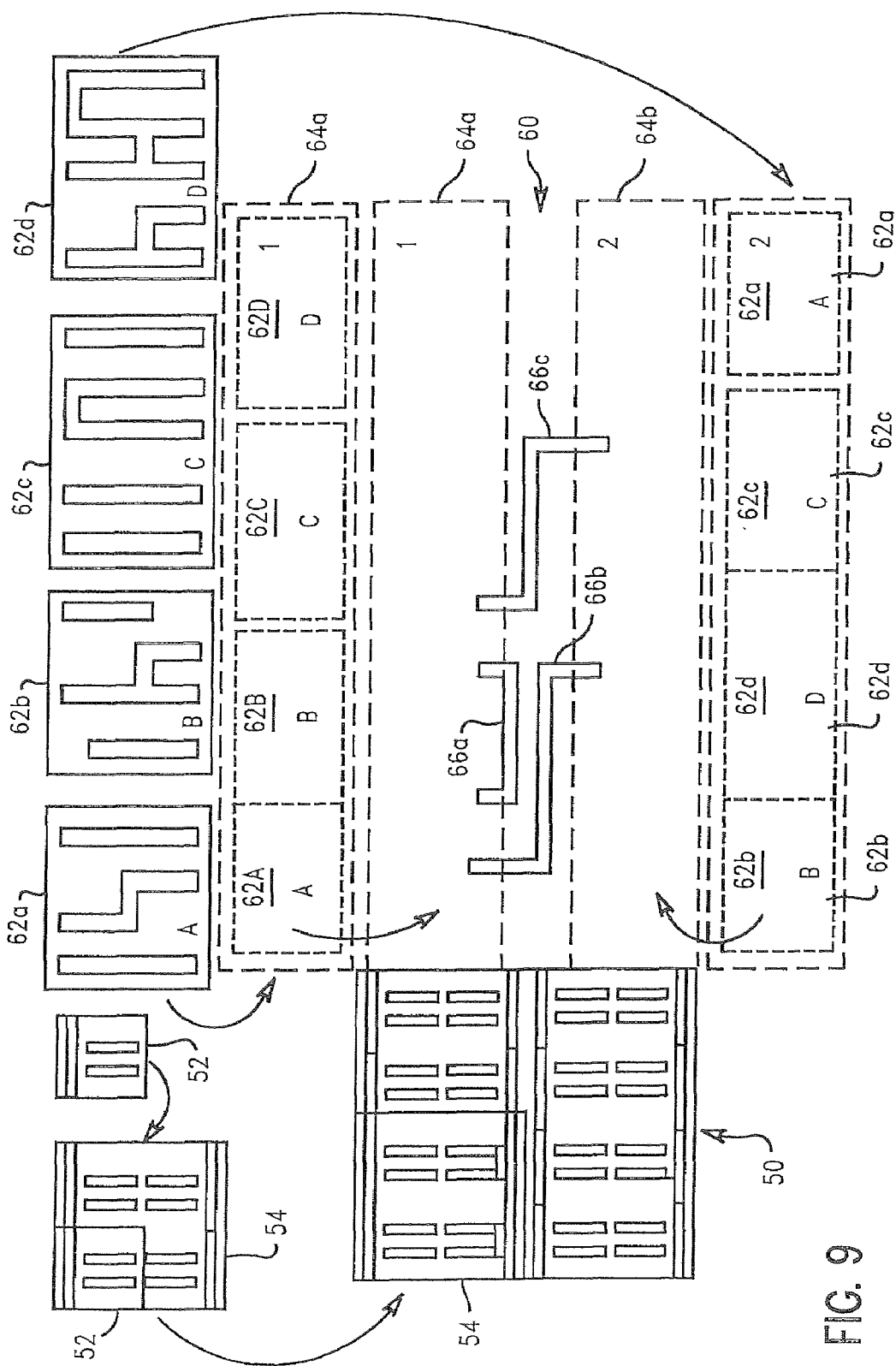
FIG. 9 is a plan view of the individual segments of the SRAM array and logic circuits needed to make the circuit design of FIG. 8.

FIG. 8 depicts a chip circuit design 70 in which the dark polygonal components are to be lithographically created by the altPSM mask. Components 50 are part of an SRAM array while components 60 are part of a logic circuit connected to the SRAM. As shown in FIG. 9, SRAM array 50 is not initially created as a whole, but is instead assembled by segments drawn in a lower level cell 52, which is then replicated in a series of geometrical links to create a two-dimensional net or sub-array 54, which is itself then replicated with other similar nets to form SRAM array 50. Similarly, individual logic cells 62a, 62b, 62c and 62d are assembled into logic rows 64a, 64b, which are then assembled into a higher design unit, i.e., logic circuit 60, with high level circuit portions 66a, 66b, 66c. The assembly of individual cells into nets or rows of cells, and further into arrays, represents the hierarchy of circuit design. To simply add phase shapes to the design of FIGS. 8 and 9 to create the required altPSM mask, as in the prior art, would be difficult.

Figure 10:
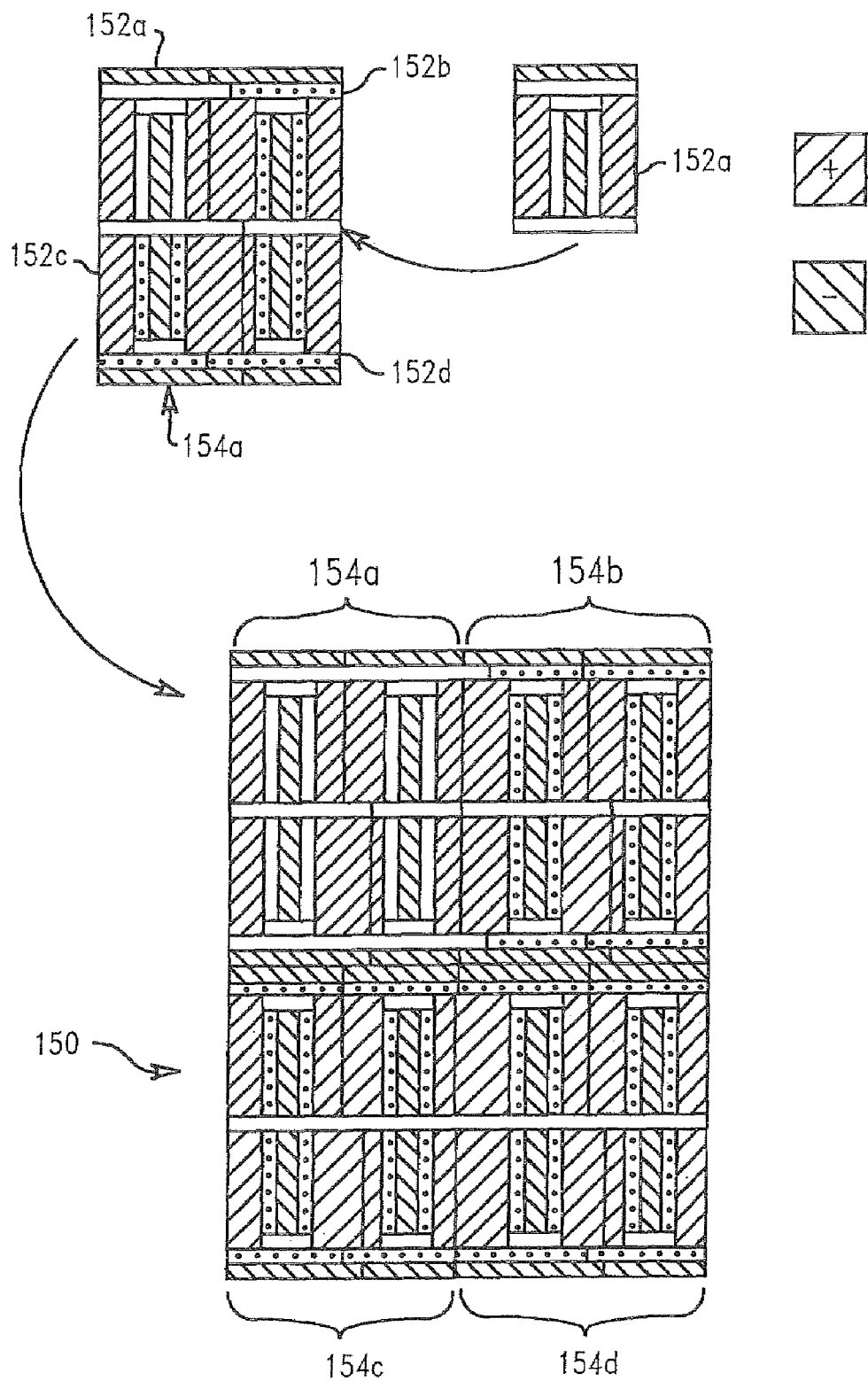
FIG. 10 is a plan view of the assembled altPSM cells to make the SRAM array of the circuit design of FIG. 8.

Instead, in accordance with the present invention, the altPSM for the circuit design of FIG. 8 is created from the individual cells, which are then combined into nets or subarrays, which nets are then further combined into the final arrays to project the circuits. In FIG. 10 there is depicted the assembly of individual cell 152a with other cells 152b, 152c and 152d to form a net 154a. Similarly constructed nets 154b, 154c and 154d are then combined with net 154a to form altPSM SRAM array 150. The different phases or colors of the phase shapes in the cells is shown by the direction of the diagonal lines in the hatching, with lines extending from upper left to lower right being one phase, e.g., 0° or color 0 or (−), while the lines extending from upper right to lower left being the opposite phase, e.g., 180° or color 1 or (+). In each hierarchical level of assembly, the boundary phases are compared it is determined whether any of the phases of adjacent cells or nets should be flipped or reversed. Only the lowest level cell is phase shifted and the phase shapes are replicated throughout the arrays by means of the existing hierarchical cell replication. In some cases, a particular design or preferred condition such as in very high density circuitry, phase shapes are preferably fixed and should not be manipulated by any further chip assembly instructions, i.e., they should be designated as not flippable.

Figure 11:
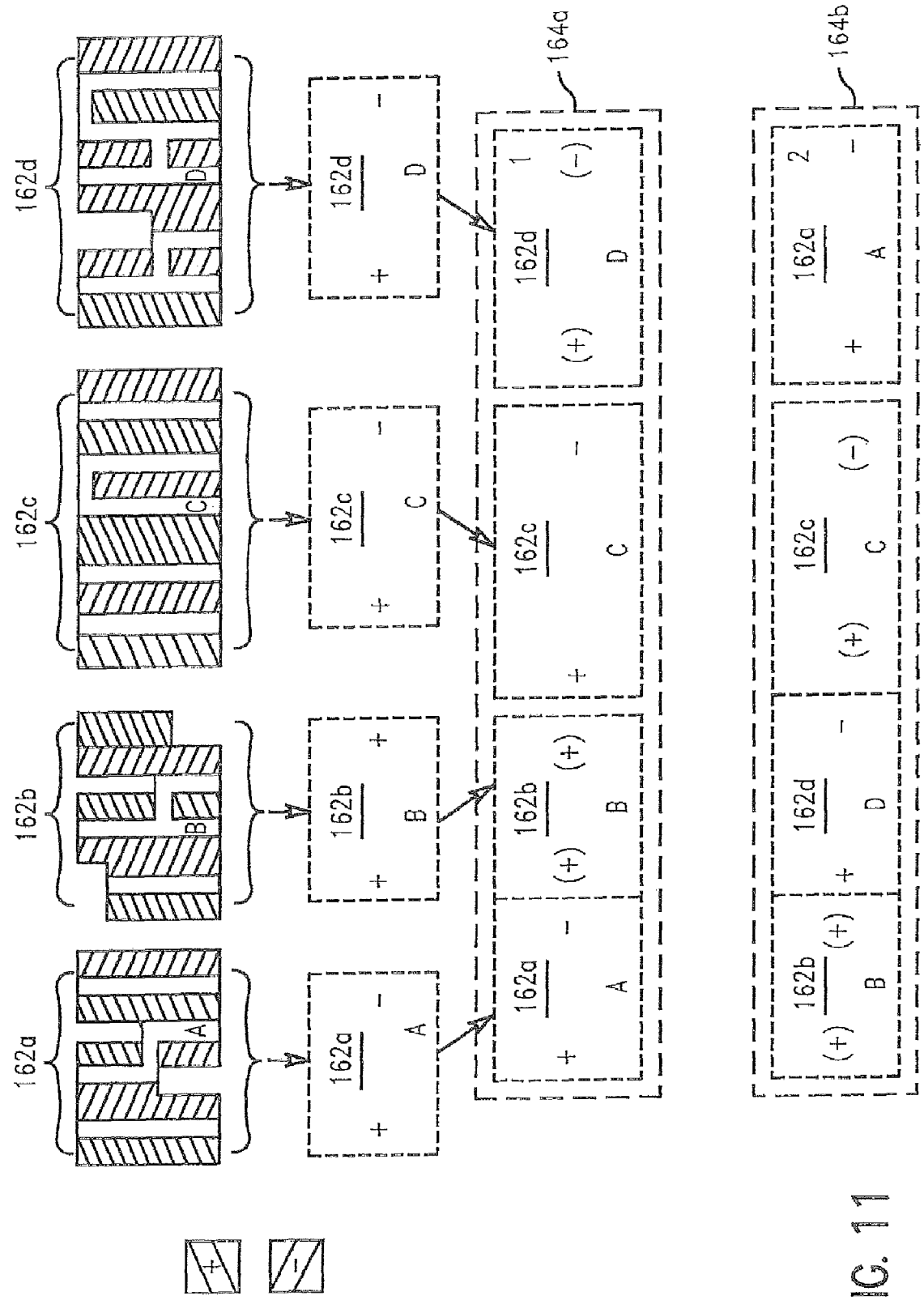
FIG. 11 is a plan view of the initially assembled altPSM cells to make the logic rows of the circuit design of FIG. 8, with the cells having conflicted phase boundary conditions.

The assembly of the altPSM mask cells to form the logic array portion of the circuit is depicted in FIG. 11. In the top row, individual cells 162a, 162b, 162c, 162d have been assigned the phase shapes, in diagonal line hatching, needed to create the components in the individual logic portions 62a, 62b, 62c, 62d, respectively. In order to determine the proper phase color assignments when the individual cells are assembled, only the initial phases of the boundary cells need be depicted, as shown by the (+) and (−) designation for the boundaries of the individual cells in the next row down. As the individual cells are placed adjacent one another and assembled into cell row 164a, the phase shapes of the individual cells will be flipped as required to avoid layout conflicts, for example the boundary conflict between cell 162a and cell 162b, and the boundary conflict between cell 162c and cell 162d. In row 164b, there are boundary conflicts between adjacent cells 162a and 162c and adjacent cells 162d and 162c.

Figure 12:
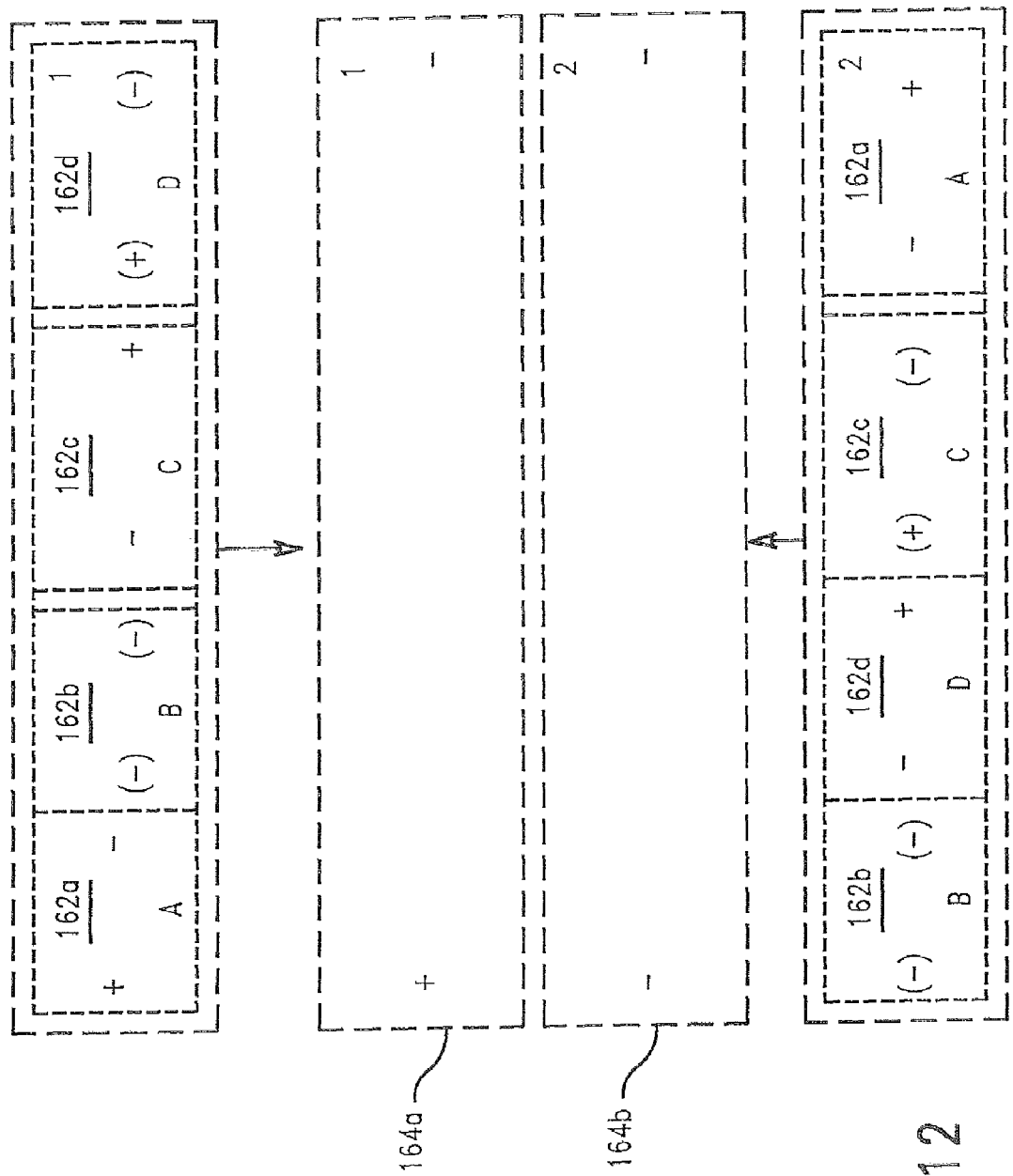
FIG. 12 is a plan view of the phases of certain cells flipped to correct the conflicted boundary conditions of the altPSM logic row cells of FIG. 11.

As described above, to accomplish this, the phase assignment of some cells may have to be flipped, i.e., all phases in the individual cell reversed, so that the relative phase assignment inside the cell is preserved while the absolute phase is adjusted to meet the boundary conditions. As shown in FIG. 12, to resolve the conflicts in row 164a, the phase shapes of cell 162b need to be flipped, so that the left boundary of cell 162b presents the color (−) to the right boundary color (−) of cell 162a. Cell 162b would then also present the color (−) at it right boundary. In like manner, the phase shapes of cell 162c need to be flipped so that it presents the color (−) at its left boundary, adjacent cell 162b, and presents the color (+) at its right boundary, adjacent cell 162d. To resolve the conflicts in row 164b, FIG. 12 shows the phase shapes in cell 162d flipped to present like colors to adjacent cell 162c, which then triggers flipping of the phase shapes in cell 162b. Likewise, at the other end of row 164b, the phase shapes in cell 162a flip to match cell 162c.

Figure 13:
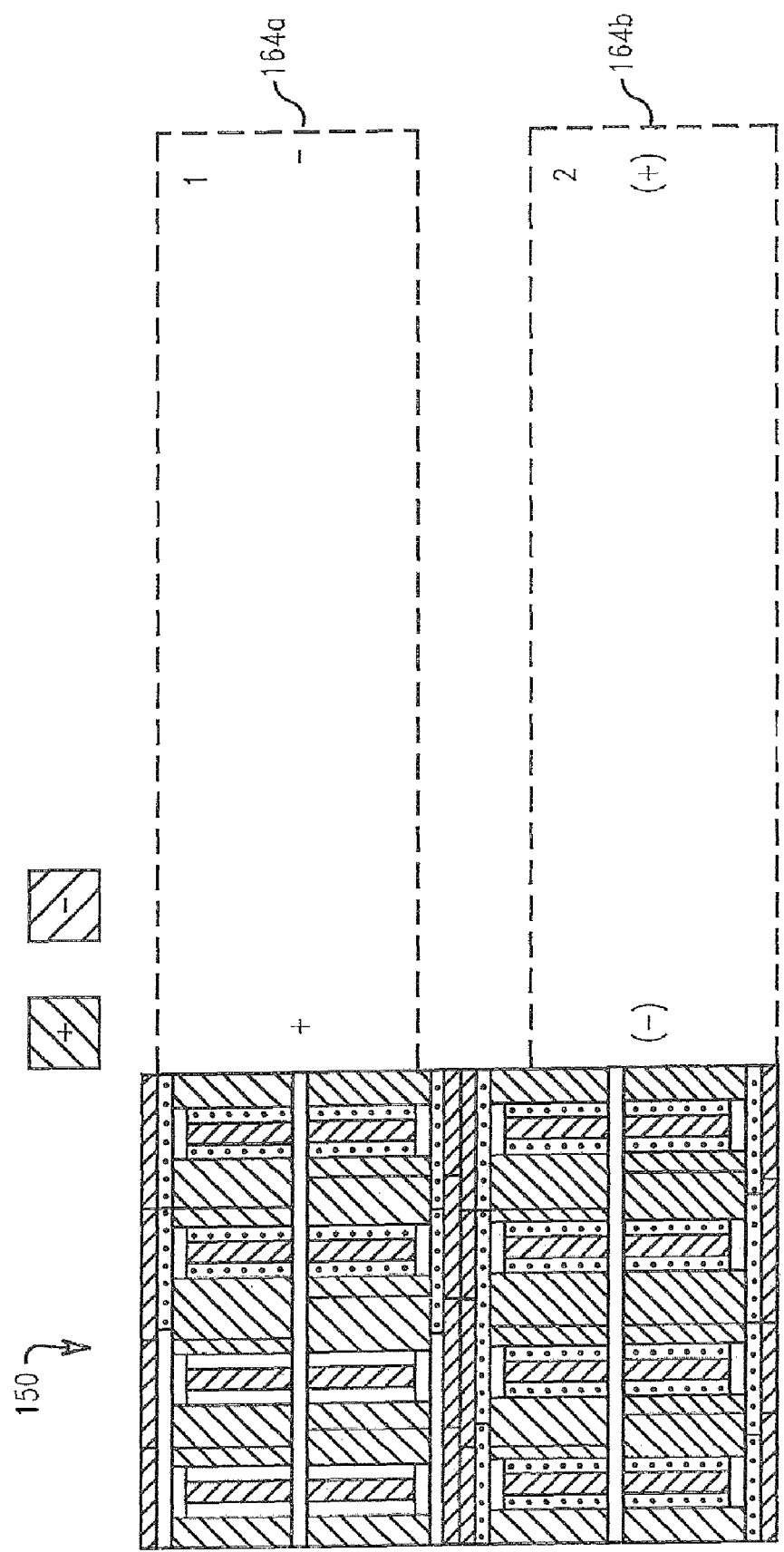
FIG. 13 is a plan view of the boundary conditions of the altPSM layout for the logic rows of FIG. 12 combined with the SRAM cell array of FIG. 10.

FIG. 13 shows the phase boundaries of the assembled rows 164a, 164b next to SRAM cell array 150. As shown in FIG. 13, there is a conflict between the left boundary phase of row 164b and the adjacent boundary phase of SRAM cell array 150.

Figure 14:
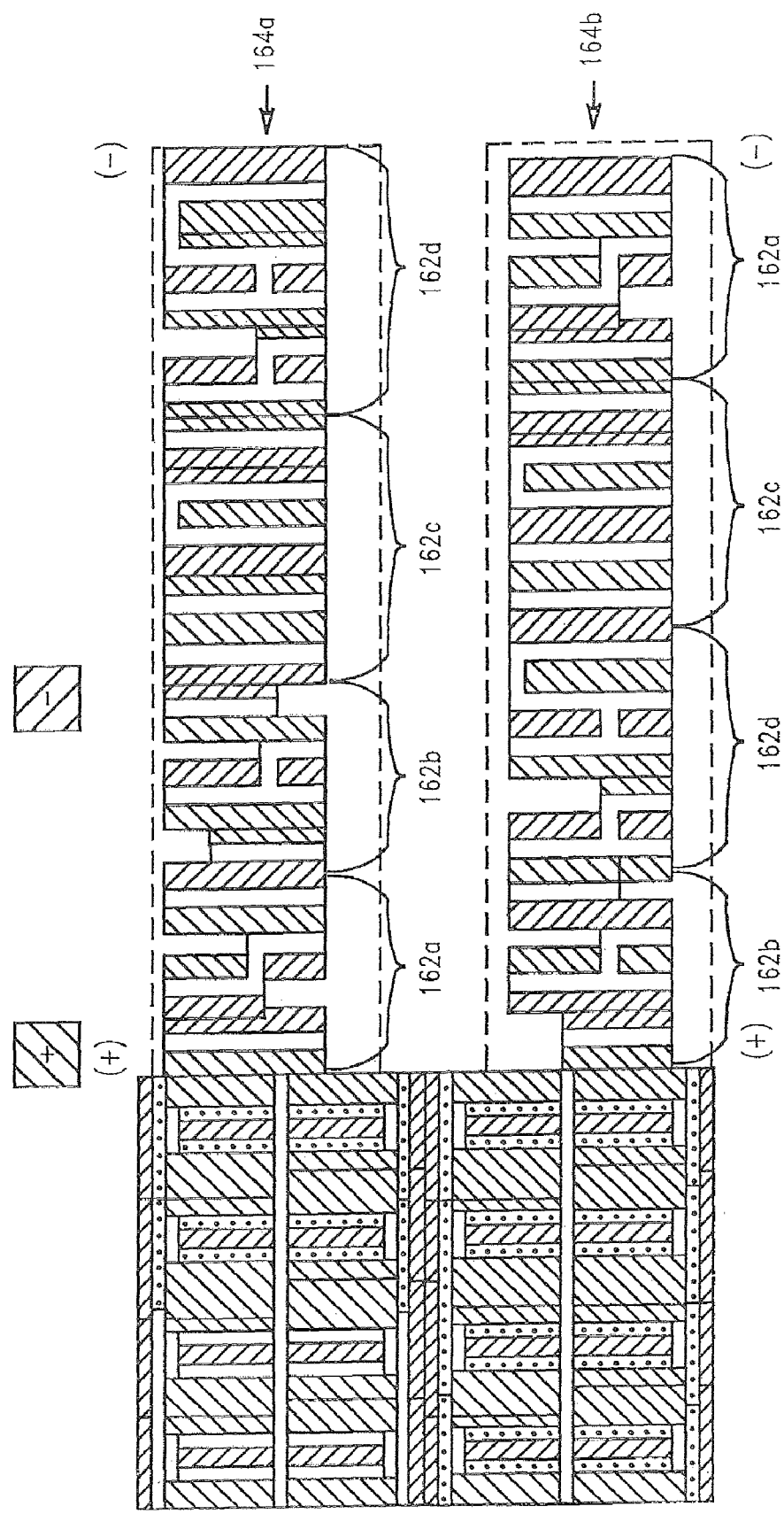
FIG. 14 is a plan view of the corrected altPSM layout for the logic rows assembled with the SRAM cell array of FIG. 10.

This conflict is resolved as shown FIG. 14, where all the phase shapes of row 164b have been reversed to change the left boundary to the phase or color (+). FIG. 14 also shows the flipped, corrected individual cell phase shape colors in logic row 164a as discussed in connection with FIG. 12.

Figure 15:
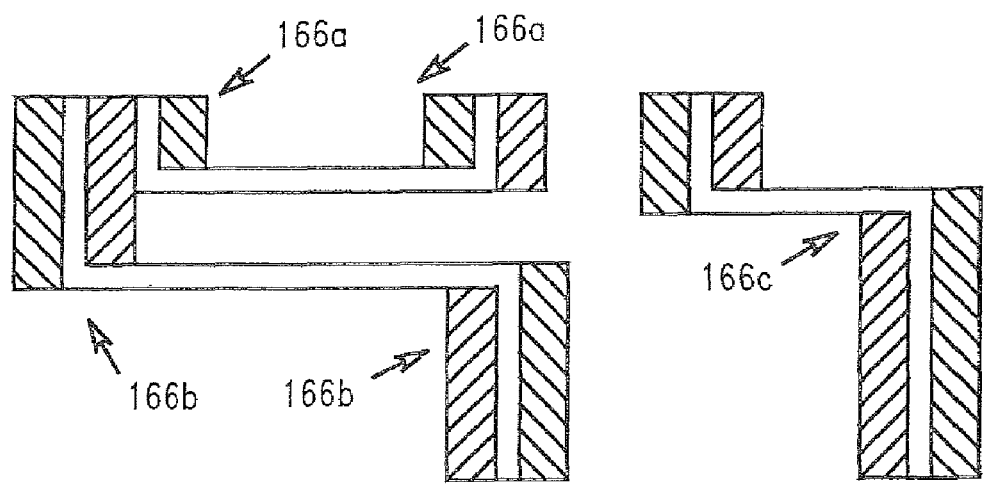
FIG. 15 is a plan view of the altPSM layout of the higher level logic circuit portion for the chip circuit design of FIG. 8.
Figure 16:
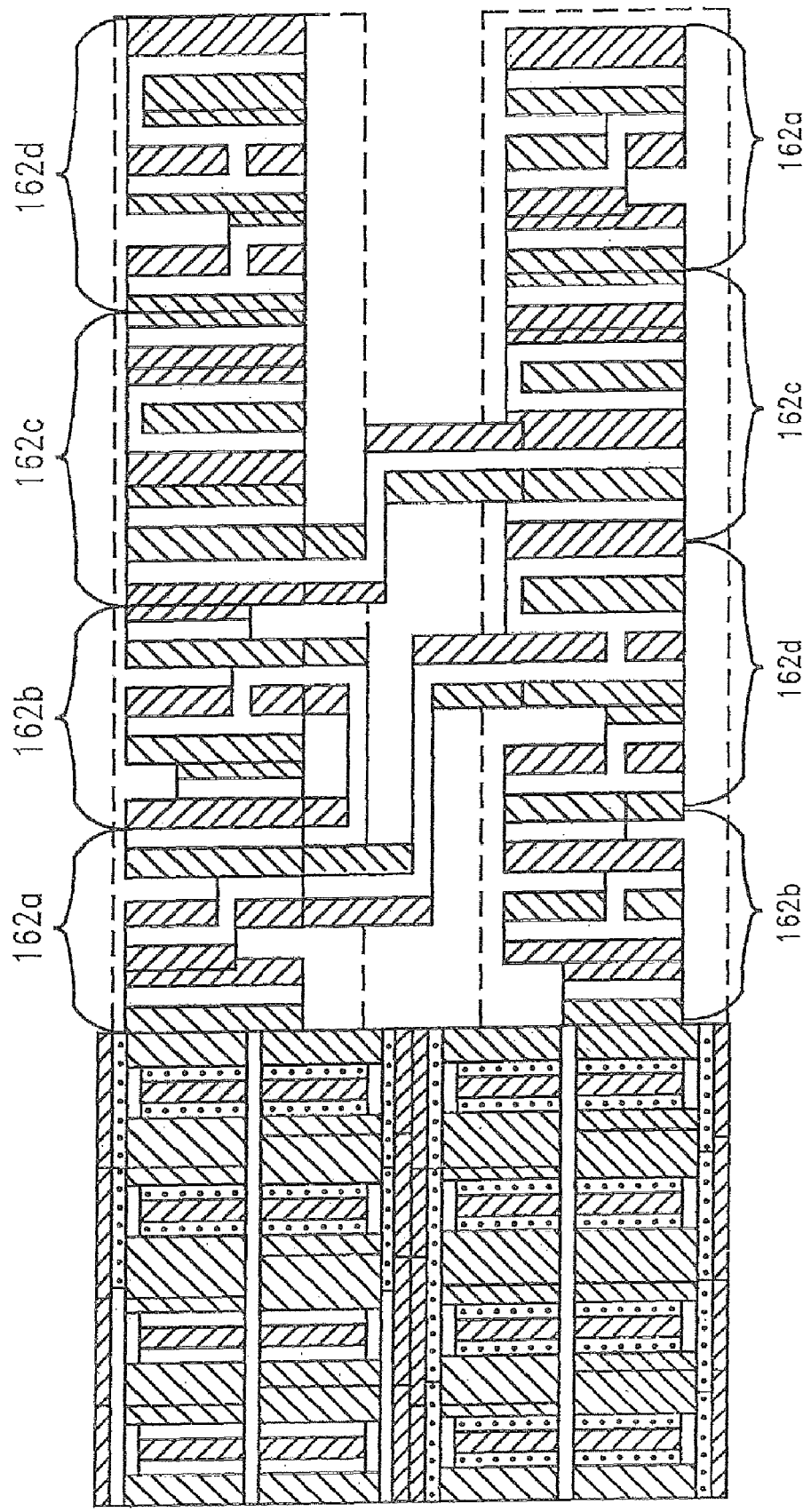
FIG. 16 is a plan view of the completed altPSM layout for the chip circuit design of FIG. 8 made in accordance with the present invention.

After the lower level design units such as SRAM cells arrays and logic rows are assembled, FIG. 15 shows the assignment of the phase shape colors of the cells 166a, 166b, 166c to produce the higher level circuit portions 66a, 66b, 66c, respectively (FIG. 9) so that there are no phase conflicts. Finally, FIG. 16 depicts the finished phase shift shapes for the SRAM and logic circuit components, with the overlaid cells 166a, b and c, with all conflicts resolved.

The method as described herein may be used in a darkfield mask design, where the element shapes are defined by the transparent regions on the mask, or in a lightfield mask design, where the background to the elements are defined by the transparent regions on the mask.

Figure 17:
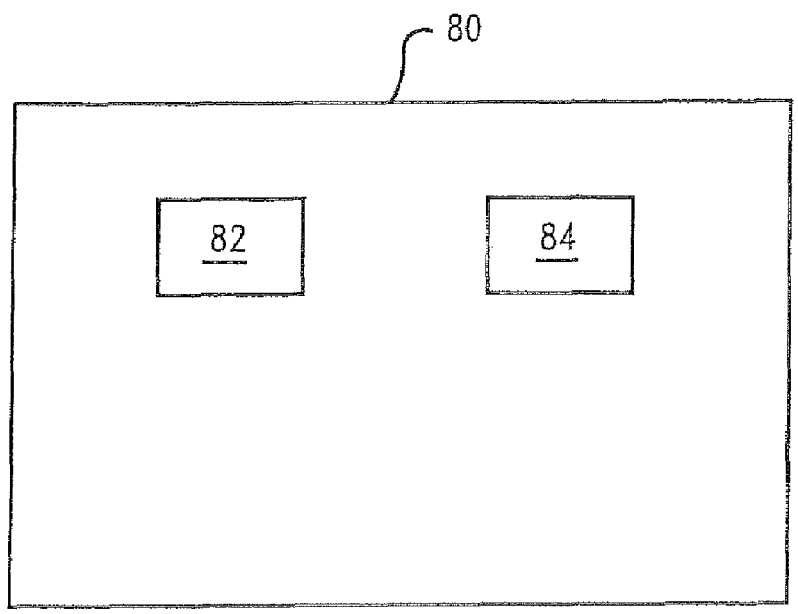
FIG. 17 is a schematic view of an electronic design automation (EDA) tool or computer containing program code in a program storage device for executing the method of coloring a partially colored design in an alternating phase shift mask in accordance with the present invention.

The method of the present invention for designing an alternating phase shifting mask may be implemented by a computer program or software incorporating the process steps and instructions described above in otherwise conventional program code and stored on an electronic design automation (EDA) tool or an otherwise conventional program storage device. As shown in FIG. 17, the program code, as well as any input information required, may be stored in EDA tool or computer 80 on program storage device 82, such as a semiconductor chip, a read-only memory, magnetic media such as a diskette or computer hard drive, or optical media such as a CD or DVD ROM. Computer system 80 has a microprocessor 84 for reading and executing the stored program code in device 82 in the manner described above.

Following design of the layout of the phase shifting segments in accordance with the aforementioned examples, the altPSMs are then fabricated by conventional, well-known methods.

Thus, the present invention may be used by designers of cells for altPSM masks to insure that the cell design is phase compliant, and so that the library elements can be pre-colored for later use in chip assembly. In this manner, design and chip assemblies may be kept under control.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A program storage device readable by a machine, tangibly embodying a program of instructions executable by the machine to perform method steps for designing a layout of an alternating phase shifting mask, the alternating phase shifting mask to be used to project an image of an integrated circuit design, the layout having a first cell comprising at least one phase shifting shape assignable to a first phase and at least one phase shifting shape assignable to a second phase opposite to the first phase, at least one of the phase shifting shapes being adjacent to an edge of the first cell, the layout further having a second cell comprising at least one phase shifting shape assignable to a first phase and at least one phase shifting shape assignable to a second phase opposite to the first phase, at least one of the phase shifting shapes being adjacent to an edge of the second cell, said method steps comprising:

providing coloring rules for assigning phases to phase shifting shapes of an alternating phase shifting mask, the phase shifting shapes within the first and second cells being binary colorable according to said coloring rules;

assigning phases to the phase shifting shapes of the first and second cells;

juxtaposing an edge of the first cell along an edge of the second cell such that the phase shifting shapes adjacent the respective first and second cell edges are adjacent each other;

after juxtaposing the edge of the first cell along the edge of the second cell, determining any spacing between the adjacent phase shifting shapes in the first and second cells;

determining any difference in phase between the adjacent phase shifting shapes in the first and second cells;

if the adjacent phase shifting shapes in the first and second cells lie less than a predetermined minimum spacing required for system resolution, and if such adjacent phase shifting shapes are of opposite phase, reversing the phase of the phase shifting shapes in one of the first and second cells such that the adjacent phase shifting shapes are of the same phase;

if the adjacent phase shifting shapes in the first and second cells are greater than the predetermined minimum spacing but less than a spacing whereby there is no interaction of transmitted light between phase shapes, inserting a dummy space between the phase shifting shapes; and creating a cell array comprising the first and second cells arranged so that said array is colorable in accordance with said coloring rules while preserving the binary colorability of said first and second cell.

2. The program storage device of claim 1 wherein the method steps further include assigning the phases to the phase shifting shapes of the first and second cells after juxtaposing the edges of the first and second cells.

3. The program storage device of claim 1 wherein the first cell comprises an end cell of a first array of cells having a plurality of phase shifting shapes of first and second phases, wherein the adjacent phase shifting shapes in the first and second cells are determined to be spaced less than the predetermined minimum spacing and of opposite phase, and wherein all of the phase shifting shapes in the first array of cells are reversed prior to creating the cell array of the first and second cells.

4. The program storage device of claim 1 wherein the first cell comprises a phase shifting shape of the first phase adjacent one edge and a phase shifting shape of the second phase adjacent an opposite edge of the cell.

5. The program storage device of claim 1 wherein the phase shifting shapes in the first cell are prevented from being reversed, and wherein the phase shifting shapes in the second cell are reversed if the adjacent phase shifting shapes in the first and second cells are determined to be spaced less than the predetermined minimum spacing and of opposite phase.

6. The program storage device of claim 1 wherein the method further includes merging the adjacent phase shifting shapes in the first and second cells.

7. The program storage device of claim 1 wherein the method further includes determining which of the first and second cells has more phase shifting shapes, and reversing the phase of the phase shifting shapes in the one of the first and second cells that has more of the phase shifting shapes.

8. An article of manufacture comprising a computer-usable medium having computer readable program code means embodied therein for designing a layout of an alternating phase shifting mask, the alternating phase shifting mask to be used to project an image of an integrated circuit design, the layout having a first cell comprising at least one phase shifting shape assignable to a first phase and at least one phase shifting shape assignable to a second phase opposite to the first phase, at least one of the phase shifting shapes being adjacent to an edge of the first cell, the layout further having a second cell comprising at least one phase shifting shape assignable to a first phase and at least one phase shifting shape assignable to a second phase opposite to the first phase, at least one of the phase shifting shapes being adjacent to an edge of the second cell, the computer readable program code means in said article of manufacture comprising:

computer readable program code means for coloring rules for assigning phases to phase shifting shapes of an alternating phase shifting mask, the phase shifting shapes within the first and second cells being binary colorable according to said coloring rules;

computer readable program code means for assigning phases to the phase shifting shapes of the first and second cells;

computer readable program code means for juxtaposing an edge of the first cell along an edge of the second cell such that the phase shifting shapes adjacent the respective first and second cell edges are adjacent each other;

computer readable program code means for determining any spacing between the adjacent phase shifting shapes in the first and second cells;

computer readable program code means for determining any difference in phase between the adjacent phase shifting shapes in the first and second cells;

if the adjacent phase shifting shapes in the first and second cells lie less than a predetermined minimum spacing required for system resolution, and if such adjacent phase shifting shapes are of opposite phase, computer readable program code means for reversing the phase of the phase shifting shapes in one of the first and second cells such that the adjacent phase shifting shapes are of the same phase;

if the adjacent phase shifting shapes in the first and second cells are greater than the predetermined minimum spacing but less than a spacing whereby there is no interaction of transmitted light between phase shapes, computer readable program code means for inserting a dummy space between the phase shifting shapes; and computer readable program code means for creating a cell array comprising the first and second cells arranged so that said array is colorable in accordance with said coloring rules while preserving the binary colorability of said first and second cell.

9. The article of manufacture of claim 8 further including computer readable program code means for: assigning the phases to the phase shifting shapes of the first and second cells after juxtaposing the edges of the first and second cells.

10. The article of manufacture of claim 8 wherein the first cell comprises a phase shifting shape of the first phase adjacent one edge and a phase shifting shape of the second phase adjacent an opposite edge of the cell.

11. The article of manufacture of claim 8 wherein the phase shifting shapes in the first cell are prevented from being reversed, and wherein the phase shifting shapes in the second cell are reversed if the adjacent phase shifting shapes in the first and second cells are determined to be spaced less than the predetermined minimum spacing and of opposite phase.

12. The article of manufacture of claim 8 further including computer readable program code means for merging the adjacent phase shifting shapes in the first and second cells.

13. The article of manufacture of claim 8 further including computer readable program code means for determining which of the first and second cells has more phase shifting shapes, and computer readable program code means for reversing the phase of the phase shifting shapes in the one of the first and second cells that has more of the phase shifting shapes.

* * * * *